United States Patent
Chen et al.

(10) Patent No.: US 11,121,078 B2
(45) Date of Patent: Sep. 14, 2021

(54) SRAM HAVING IRREGULARLY SHAPED METAL LINES

(71) Applicant: Taiwan Semiconductor Manufacturing Co., Ltd., Hsin-Chu (TW)

(72) Inventors: Jui-Lin Chen, Taipei (TW); Chao-Yuan Chang, Hsinchu (TW); Yu-Kuan Lin, Taipei (TW); Chang-Ta Yang, Hsinchu (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 76 days.

(21) Appl. No.: 16/573,769

(22) Filed: Sep. 17, 2019

(65) Prior Publication Data
US 2021/0082475 A1    Mar. 18, 2021

(51) Int. Cl.
| *H01L 23/522* | (2006.01) |
| *G11C 5/06* | (2006.01) |
| *H01L 29/78* | (2006.01) |
| *H01L 27/11* | (2006.01) |
| *H01L 27/092* | (2006.01) |
| *G06F 30/394* | (2020.01) |

(52) U.S. Cl.
CPC ........ *H01L 23/5226* (2013.01); *G06F 30/394* (2020.01); *G11C 5/063* (2013.01); *H01L 27/0924* (2013.01); *H01L 27/1104* (2013.01); *H01L 29/785* (2013.01)

(58) Field of Classification Search
CPC ... H01L 23/52; H01L 23/522; H01L 23/5221; H01L 23/5226; H01L 23/528; H01L 23/5283; H01L 23/5286; H01L 23/535; H01L 23/538; H01L 23/5386; H01L 27/06; H01L 27/088; H01L 27/0924; H01L 27/10; H01L 27/10882; H01L 27/10885; H01L 27/10888; H01L 27/10897; H01L 27/1104; H01L 27/2463; H01L 29/66409; H01L 29/78; H01L 29/785; G11C 5/06; G11C 5/063
See application file for complete search history.

(56) References Cited

U.S. PATENT DOCUMENTS 10,734,400 B1 *  8/2020  Fukuo ................. H01L 23/5329
2014/0103446 A1   4/2014  Lim et al.

FOREIGN PATENT DOCUMENTS

KR      20140049356        4/2014

* cited by examiner

*Primary Examiner* — Cheung Lee
(74) *Attorney, Agent, or Firm* — Haynes and Boone, LLP

(57) ABSTRACT

A semiconductor device includes a gate structure, a source/drain, a first via that is disposed over the gate structure and the source/drain, and a first metal line having a more elevated vertical position than the first via in a cross-sectional view. The first via is electrically coupled to both the gate structure and the source/drain. The first metal line and the first via each extends in a first direction. A first distance separates the metal line from the via in a second direction different from the first direction. The first metal line includes a protruding portion that protrudes outwardly in the second direction.

20 Claims, 10 Drawing Sheets

SRAM HAVING IRREGULARLY SHAPED METAL LINES

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, parasitic effects may be impacting SRAM device performance more and more. For example, parasitic resistance may become a greater factor as semiconductor feature sizes continue to shrink, which may degrade a minimum operating voltage (Vmin) of an SRAM cell. This may lead to sub-par SRAM performance or even device failures.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
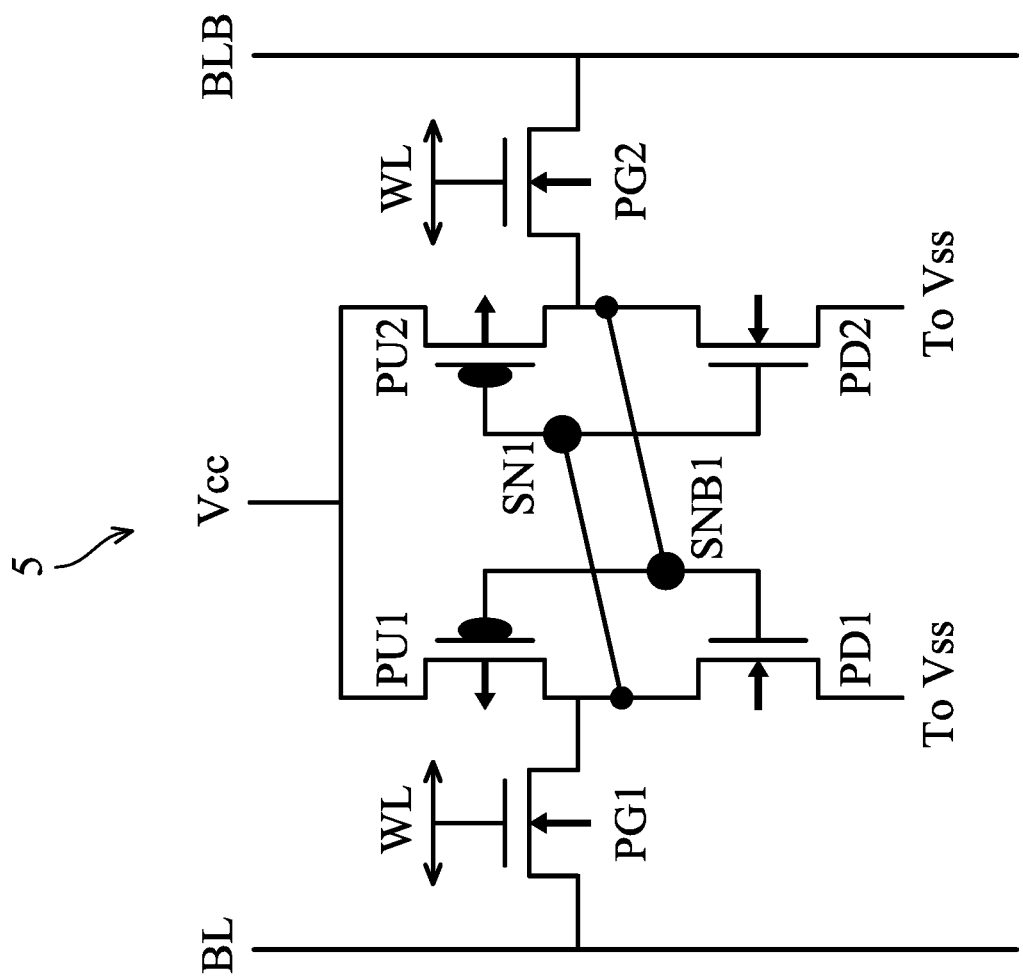
FIG. 1 illustrates a circuit schematic for a 1-bit SRAM cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm.

The present disclosure is directed to, but not otherwise limited to, a static random access memory (SRAM) device. An SRAM device is a type of semiconductor memory that uses bi-stable latching circuitry (e.g., flip-flop) to store binary bits of information. FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs, and transistors PG1, PG2, PD1, and PD2 are n-type transistors, such as n-type FinFETs. Since the SRAM cell 5 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects of the following disclosure may be discussed using FinFET devices as examples, but it is understood that the application is not limited to FinFET devices, except as specifically claimed.

Figure 2:
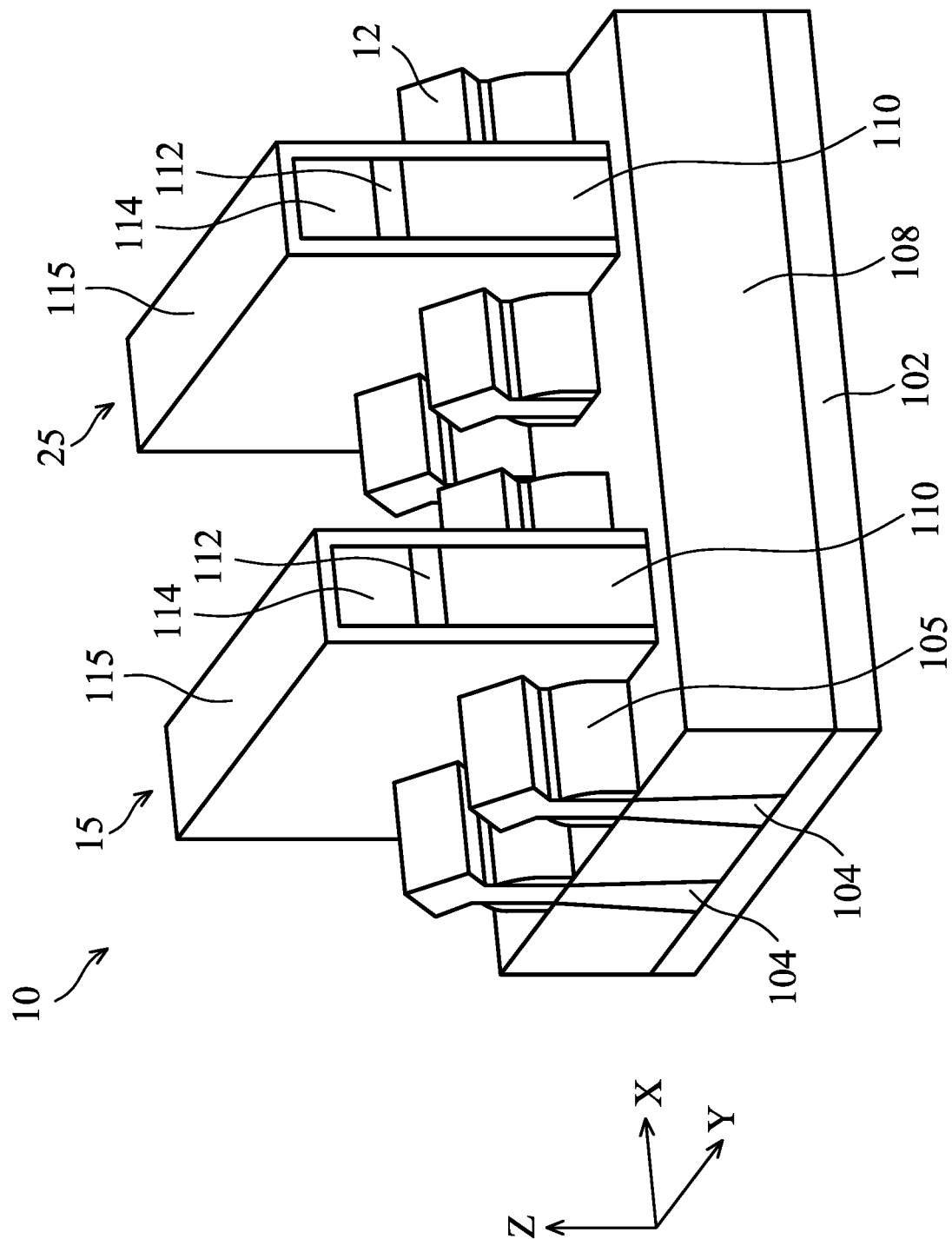
FIG. 2 illustrates a perspective three-dimensional view of a FinFET device according to an embodiment of the present disclosure.

Referring to FIG. 2, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 2. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

Figure 3:
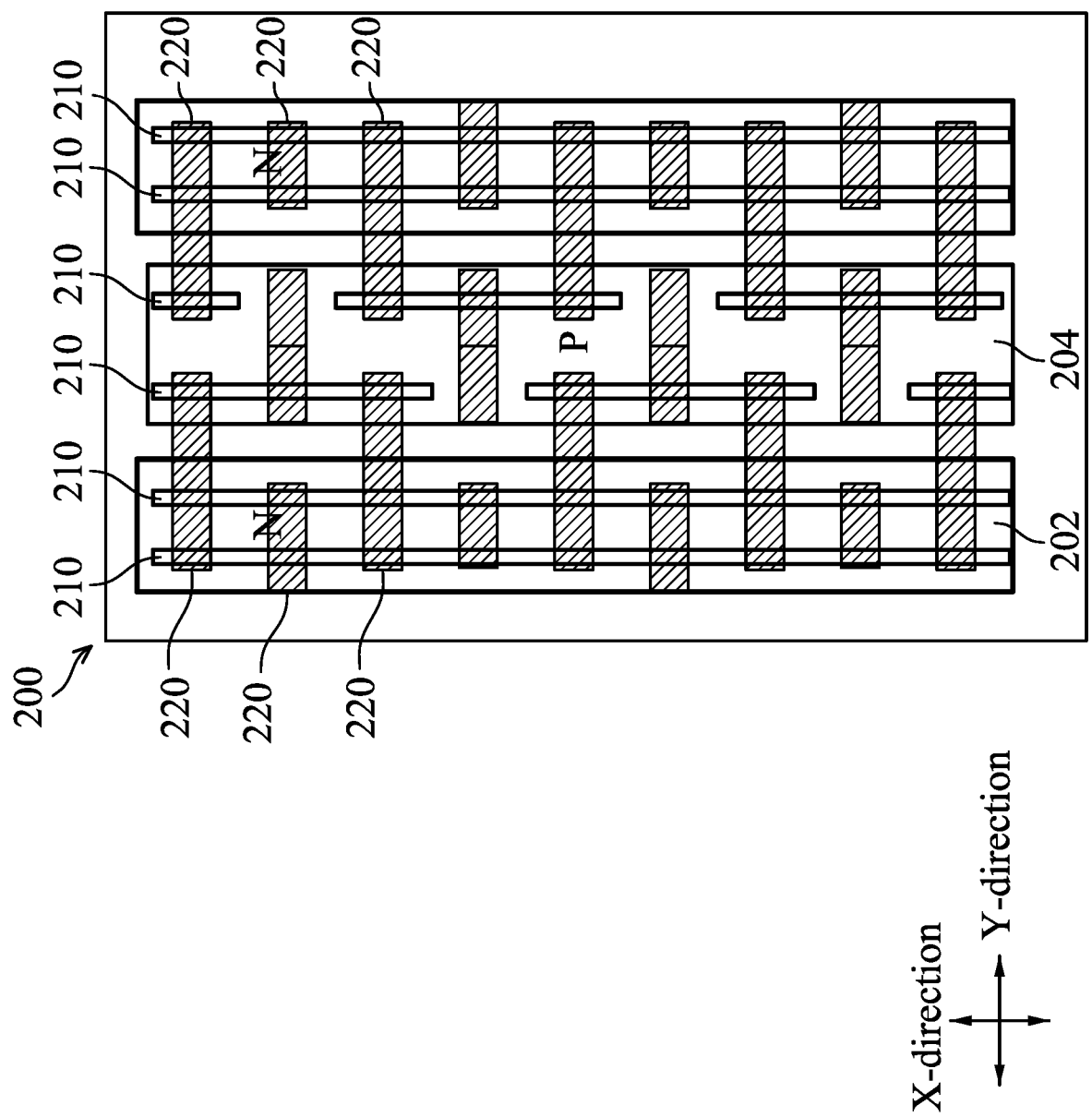
FIG. 3 illustrates a top view layout of a portion of an SRAM cell array according to an embodiment of the present disclosure.

FIG. 3 illustrates a top view of a portion of an SRAM cell array 200 that is implemented using FinFETs according to embodiments of the present disclosure. The top view of FIG. 3 is defined by an X-axis (spanning alone the X-direction of FIG. 2) and a Y-axis (spanning alone the Y-direction of FIG. 2). Note that the X-axis is the vertical axis in FIG. 3, and the Y-axis is the horizontal axis in FIG. 3.

The SRAM cell array 200 includes a plurality of SRAM cells, for example SRAM cells such as the SRAM cell 5 (e.g., the 6T SRAM cell) of FIG. 1. The SRAM cell array 200 includes N-doped regions 202 (or N-wells) and P-doped regions 204 (or P-wells). In both the N-doped regions 202 and the P-doped regions 204, the SRAM cell array 200 includes a plurality of fin lines 210 that each extend in an elongated manner in the X-direction. The fin lines 210 may be implemented using the fin structures 104 of FIG. 2. The SRAM cell array 200 also includes a plurality of gate structures 220, which may be implemented by the gate structures 15 and 25 of FIG. 2 (depending on whether the gate structure is for an NFET or a PFET). The gate structures 220 may each wrap around one or more of the fin lines 210, but in the top view of FIG. 2, the gate structures 220 are illustrated as extending in the Y-direction that is perpendicular to the X-direction in which the fin lines 210 extend. The fin lines 210 and the gate structures 220 form transistors. For example, in an embodiment, the pull-up (PU) transistors of the SRAM cell 5 are formed by the transistors in the N-doped region, and the pull-down (PD) transistors and the pass-gate (PG) transistors are formed by the transistors in the P-doped region.

Figure 4:
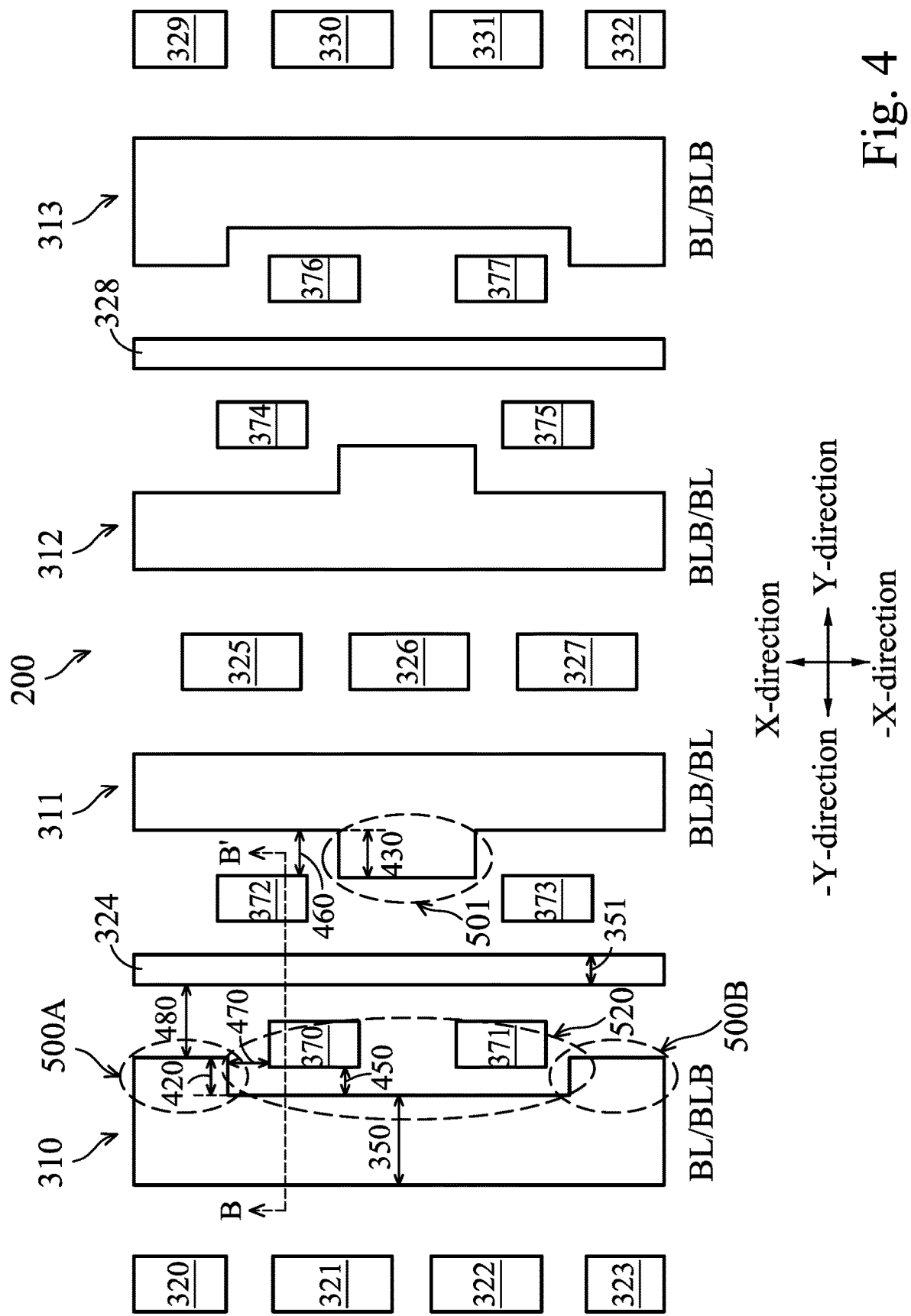
FIG. 4 illustrates a top view layout of another portion of an SRAM cell array according to an embodiment of the present disclosure.

FIG. 4 illustrates another top view of another portion of the SRAM cell array 200 (e.g., the SRAM cell array of FIG. 3, which is comprised of the 6T SRAM cells shown in FIG. 1). Note that the top view may correspond to an idealized top view of the SRAM cell array 200, for example the various components shown in FIG. 4 may have straight edges or are shaped as rectangles or polygons. In actually fabricated devices, the components in FIG. 4 may have more rounded, curved, or otherwise non-straight edges. In some embodiments, the top view of FIG. 4 may correspond to the top view of the patterns on one or more photomasks that are used to form the SRAM cell array 200, as the patterns on lithography masks do have more straight edges and resemble the rectangles or polygons more closely than the patterns on an actually fabricated device.

The portion of the SRAM cell array 200 shown in FIG. 4 includes a plurality of conductive lines, such as metal lines 310-313 and 320-332 of a metal-0 interconnect layer (also referred to as an M0 layer) of a multi-layered interconnect (MLI) structure. In that regard, the MLI structure may be formed over a substrate and may include a plurality of patterned dielectric layers and conductive layers that provide interconnections (e.g., wiring) between the various microelectronic components of a semiconductor device (e.g., the SRAM cell array 200). For example, the MLI structure may include a plurality of conductive components, for example contacts, vias, or metal lines. The metal lines may be disposed in a plurality of metal layers that are stacked over one another vertically, and the vias are used to electrically interconnect the metal lines from different layers together. Contacts and vias may also provide electrical connectivity to transistor components such as gate, source, and/or drain. The conductive components may contain conductive materials such as aluminum, aluminum/silicon/copper alloy, titanium, titanium nitride, tungsten, polysilicon, metal silicide, or combinations thereof. Alternatively, the conductive components may include copper, copper alloy, titanium, titanium nitride, tantalum, tantalum nitride, tungsten, polysilicon, metal silicide, or combinations thereof.

The MLI structure may also include an interlayer dielectric (ILD) that surrounds the conductive components. The ILD may provide electrical isolation for the conductive components. In some embodiments, the ILD may include a low-k dielectric material (e.g., a dielectric material having a dielectric constant that is smaller than a dielectric constant of silicon dioxide, which is about 4). As non-limiting examples, the low-k dielectric material may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on organic polymeric dielectrics, spin-on silicon based polymeric dielectrics, or combinations thereof.

As shown in FIG. 4, the metal lines 310-313 and 320-332 each extend in an elongated manner in the X-direction. In some embodiments, the metal lines 310-313 are each a bit line (BL) or a bit line bar (BLB) (see FIG. 1) of the SRAM cell array 200. For example, the metal lines 310 and 313 may each be a BL, and the metal lines 311-312 may each be a BLB. Alternatively, the metal lines 310 and 313 may each be a BLB, and the metal lines 311-312 may each be a BL. For reasons of simplicity, the metal lines 310-313 may be referred to as BLs 310-313 (even though some of them are BLBs) interchangeably hereinafter.

In some embodiments of the SRAM cell array 200, the BLs 310-313 each extends continuously through multiple SRAM cells in the top view. For example, each of the BLs 310-313 may extend through an entirety of the SRAM cell array 200 in the X-direction in the top view. As an electrical conductor, ideally the BLs 310-313 should have substantially zero electrical resistance. However, in real world devices, each of the BLs 310-313 may generate a parasitic electrical resistance that is a function of its size (e.g., both a length in the X-direction and a width in the Y-direction). For example, as the width (e.g., lateral dimension measured in the Y-direction) of a BL decreases, the parasitic electrical resistance may increase. In old technology generations that are greater than the 5-nanometer technology generation, such a parasitic electrical resistance may be somewhat negligible, since the dimensions of the BLs may be sufficiently large.

However, as the device scaling down trend continues to shrink the dimensions of microelectronic components (e.g., including the dimensions of the BLs 310-313), the electrical resistance may rise to a level that is no longer negligible but that could significantly degrade the performance of a semiconductor device. For example, according to Ohm's law, a voltage drop across a length of a resistor is equal to an electrical current running through the resistor multiplied by the electrical resistance of the resistor. This relationship between voltage and resistance may be mathematically expressed as V=I*R, where V represents voltage, I represents electrical current, and R represents electrical resistance. In the case at hand, each of the BLs 310-313 may be modeled as a resistor (due to its parasitic resistance). As such, each of the BLs 310-313 may experience a voltage drop across the length thereof (in the X-direction) during an operation of the SRAM cell array 200. This voltage drop may degrade certain SRAM operating parameters or criteria, such as a minimum operating voltage (hereinafter referred to as Vmin). In some cases, the degradation of the Vmin may be in a range from about 5 milli-volts (mV) to about 200 mV. If Vmin is not satisfied, a SRAM cell may experience read failures, write failures, access failures, and/or retention failures. To exacerbate the problem, the device scaling down process may also be accompanied by the need to scale down the SRAM supply voltages (e.g., Vdd). Since the Vmin may be correlated with supply voltages, the scaling down of supply voltages may further reduce the margin of error (or the amount of degradation) that the Vmin can experience.

The present disclosure alleviates the Vmin degradation problem by selectively enlarging the BLs 310-313, so as to reduce their electrical resistance. As a result, the BLs 310-313 each have a top view profile that is not entirely linear but rather zig-zag shaped. For example, the BLs 310-313 each includes one or more protrusions that protrude laterally in the Y-direction. In comparison, such lateral protrusions are absent in the metal lines 320-332. The zig-zag shape of the BLs 310-313 (or alternatively stated, the presence of their lateral protrusions) is one of the unique physical characteristics of the SRAM cell array 200 of the present disclosure, and it will be discussed in greater detail below.

Still referring to FIG. 4, the metal lines 324 and 328 also each extend in an elongated manner in the X-direction. In some embodiments, the metal lines 324 and 328 are each a Vcc (see FIG. 1) of the SRAM cell array 200. The metal lines 324 and 328 may also each be narrower in the Y-direction than each of the BLs 310-313. As shown in FIG. 4, the BLs 310-313 may have a minimum lateral dimension 350 (measured at its thinnest portion) in the Y-direction, and the metal lines 324 and 328 may each have a minimum lateral dimension 351 in the Y-direction. The lateral dimension 350 is substantially greater than the lateral dimension 351, for example at least 50% greater in some embodiments. The differences between the dimensions 350 and 351 may be due to the fact that they are configured to tolerate different voltages or currents. Wider BLs 310-313 results in a reduced resistance, which allows them to handle greater voltages or currents.

Whereas the BLs 310-313 and the metal lines 324 and 328 are continuous, in that they continue to extend in the X-direction beyond what is shown in FIG. 4 (since FIG. 4 is a fragmentary view of merely a portion of the SRAM cell array 200), the metal lines 320-323, 325-327, and 329-332 in comparison are discontinuous metal "islands", since they are separated from one another in the X-direction. In some embodiments, the metal lines 320-323, 325-327, and 329-332 are the metallization components for the WL or Vss (see FIG. 1) of the SRAM cell array 200. In other words, the metal lines 320-323, 325-327, and 329-332 are electrically coupled to the WL or Vss, where the WL or Vss may be implemented as metal lines in a separate metal layer (e.g., a metal-1 layer above the metal-0 layer) of the MLI structure.

Figure 5:
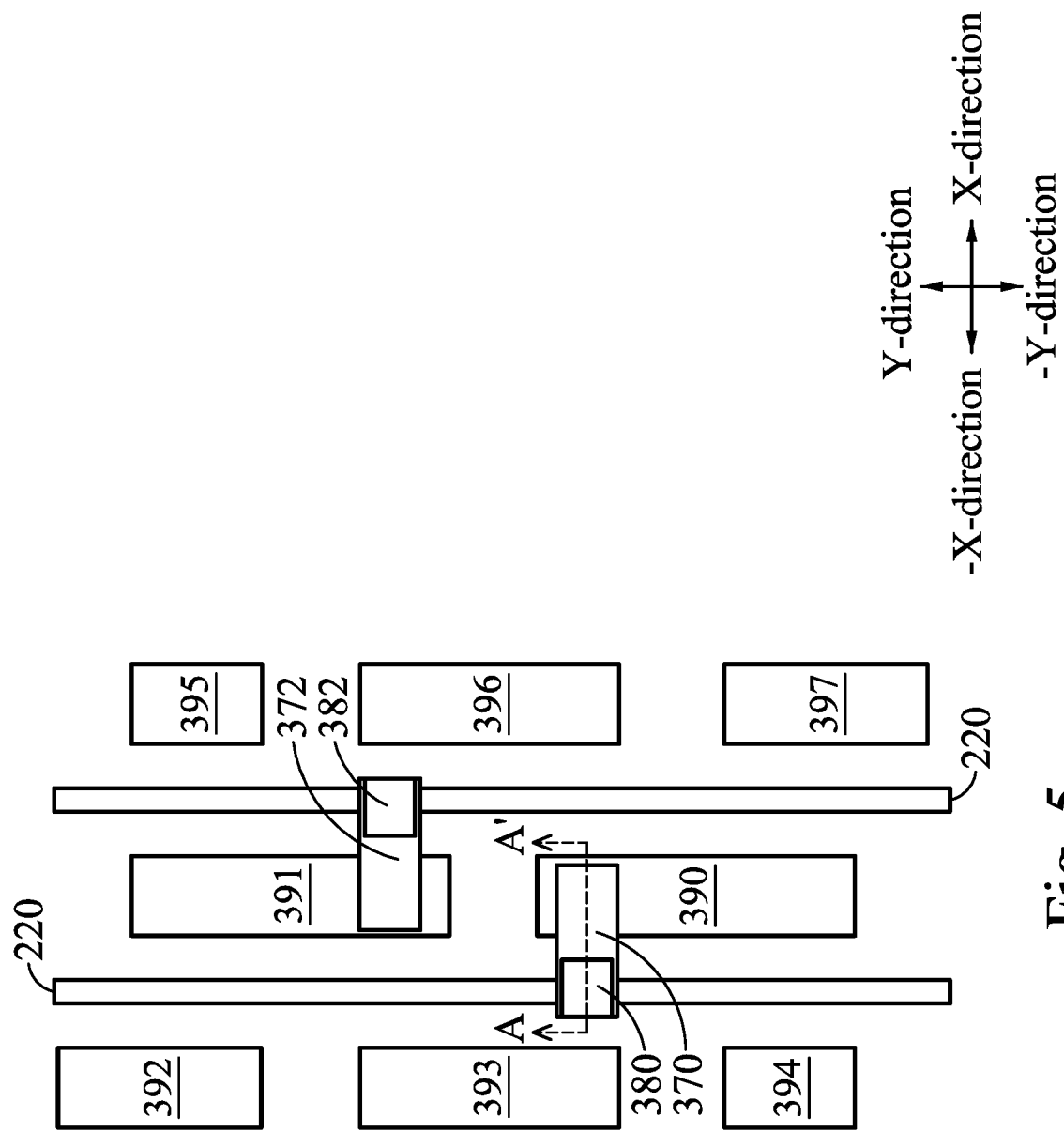
FIG. 5 illustrates a top view layout of yet another portion of an SRAM cell array according to an embodiment of the present disclosure.
Figure 6:
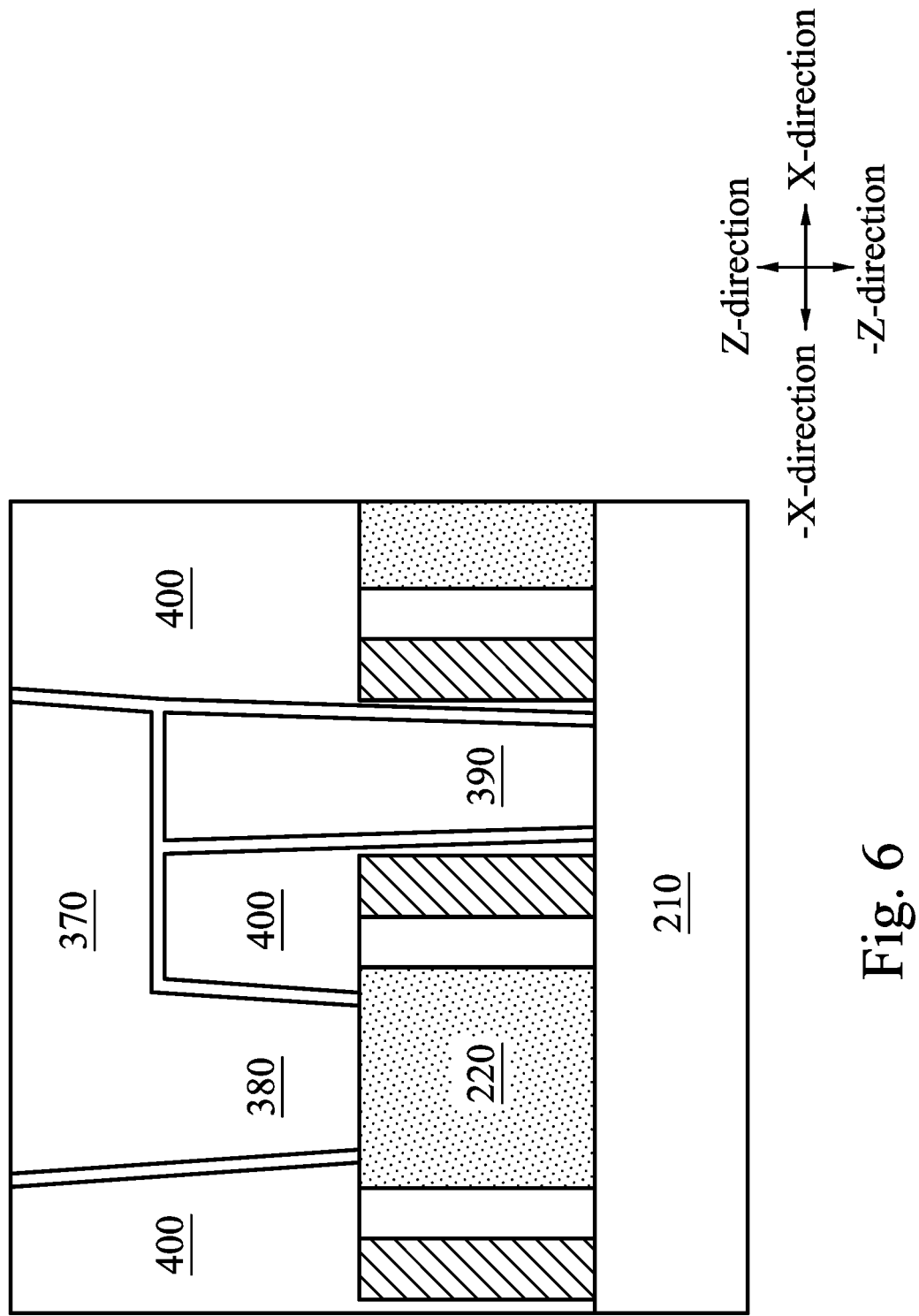
FIG. 6 illustrates a cross-sectional side view of a portion of an SRAM cell array according to an embodiment of the present disclosure.

The SRAM cell array 200 further includes a plurality conductive vias, such as vias 370-377 (also referred to as vias hereinafter) shown in FIG. 4. Each of the vias 370-377 extend in an elongated manner in the X-direction and may be configured to electrically couple together a gate structure (e.g., one of the gate structures 220 in FIG. 3) and a source/drain. This is more clearly illustrated in FIGS. 5-6. In that regard, FIG. 5 is a fragmentary diagrammatic top view of a portion of a semiconductor device (e.g., a portion of the SRAM cell array 200) that includes some of the vias, such as the vias 370 and 372. Note that the X-direction and the Y-direction in FIG. 5 are each rotated by 90 degrees compared to FIG. 4. FIG. 6 is a fragmentary diagrammatic cross-sectional side view taken along a cutline A-A' that extends in the X-direction in FIG. 5. In other words, the cross-sectional view in FIG. 6 is obtained by taking the cross-sectional cut along an X-Z plane defined by the X-direction (horizontally) and the Z-direction (vertically).

As shown in FIGS. 5-6, gate structures 220 are each formed to extend in an elongated manner in the Y-direction and are formed over the fin structure 210 in the Z-direction (see FIG. 6). The gate structure 220 also partially wraps around the fin structure 210 in the manner shown in FIG. 2, though this aspect may not be readily apparent in FIG. 6 due to it being a cross-sectional drawing. In other words, FIG. 6 shows a portion of the cross-section where the gate structure 220 is located above the fin structure 210. The gate structures 220 may each include a high-k gate dielectric and a metal gate electrode. In other words, the gate structures 220 may each be a HKMG structure A gate via 380 is formed over one of the gate structures 220 in the Z— direction, and a gate via 382 is formed over another one of the gate structures 220 in the Z-direction. The gate vias 380 and 382 each contains an electrically conductive material (e.g., a metal or a metal compound) and provides electrically connectivity to their respective gate structures 220. Meanwhile, source/drain vias 390-397 are each formed over a portion of the fin structure 210 in the Z-direction, for example over a source/drain portion of the fin structure 210. The source/drains vias 390-397 also each contains an electrically conductive material (e.g., a metal or a metal compound) and provides electrical connectivity to their respective source/drains. The source/drain vias 390-397 may also be referred to as source/drain contacts or diffusion contacts. Note that since the cross-section of FIG. 6 is taken along the cutline A-A' (over a portion of the source/drain via 390), the source/drain via 390 is visible in the cross-sectional view of FIG. 6, but the rest of the vias 391-397 are not readily visible in FIG. 6. In the illustrated embodiment, the via 370 is larger than the gate via 380 in the top view, because the via 370 is connected to both the gate structure 220 and the source/drain via 390, while the gate via 380 merely needs to be connected to the gate structure 220.

As shown in FIG. 6, the via 370 is formed over the gate via 380 and the source/drain via 390 in the Z-direction. The via 370 spans horizontally in the X-direction and electrically couples the gate via 380 and the source/drain via 390 together, since one end of the via 370 is formed over and electrically connected to the gate via 380, and another end of the via 370 is formed over and electrically connected to the source/drain via 390. It is understood that although FIGS. 5-6 illustrate and label the gate via 380 and the via 370 as two separate components, it is not necessarily the case. For example, in some embodiments, the via holes for the gate via 380 and the via 370 may be formed at the same time (or using the same processes), and subsequently a conductive material is formed to fill these via holes simultaneously. In these embodiments, the gate via 380 and the via 370 may include the same materials and may be viewed as the same structure (e.g., the same via), and there may not be a distinctive interface between the gate via 380 and the via 370. However, in other embodiments, the gate via 380 and the via 370 may indeed be formed separately and/or may include different materials. In any case, since the gate via 380 and source/drain via 390 provide electrical connectivity to the gate structure 220 and the source/drain (e.g., a portion of the fin structure 210), respectively, the via 370 can establish electrical connectivity between the gate and source/drain of a transistor.

Also as shown in FIG. 6, an electrical isolation structure 400 may be formed around the via 370 and the gate via 380 and source/drain via 390 to provide electrical isolation from other microelectronic components. In some embodiments, the electrical isolation structure 400 may include an interlayer dielectric (ILD) structure, which may contain a low-k material as a non-limiting example.

Figure 7:
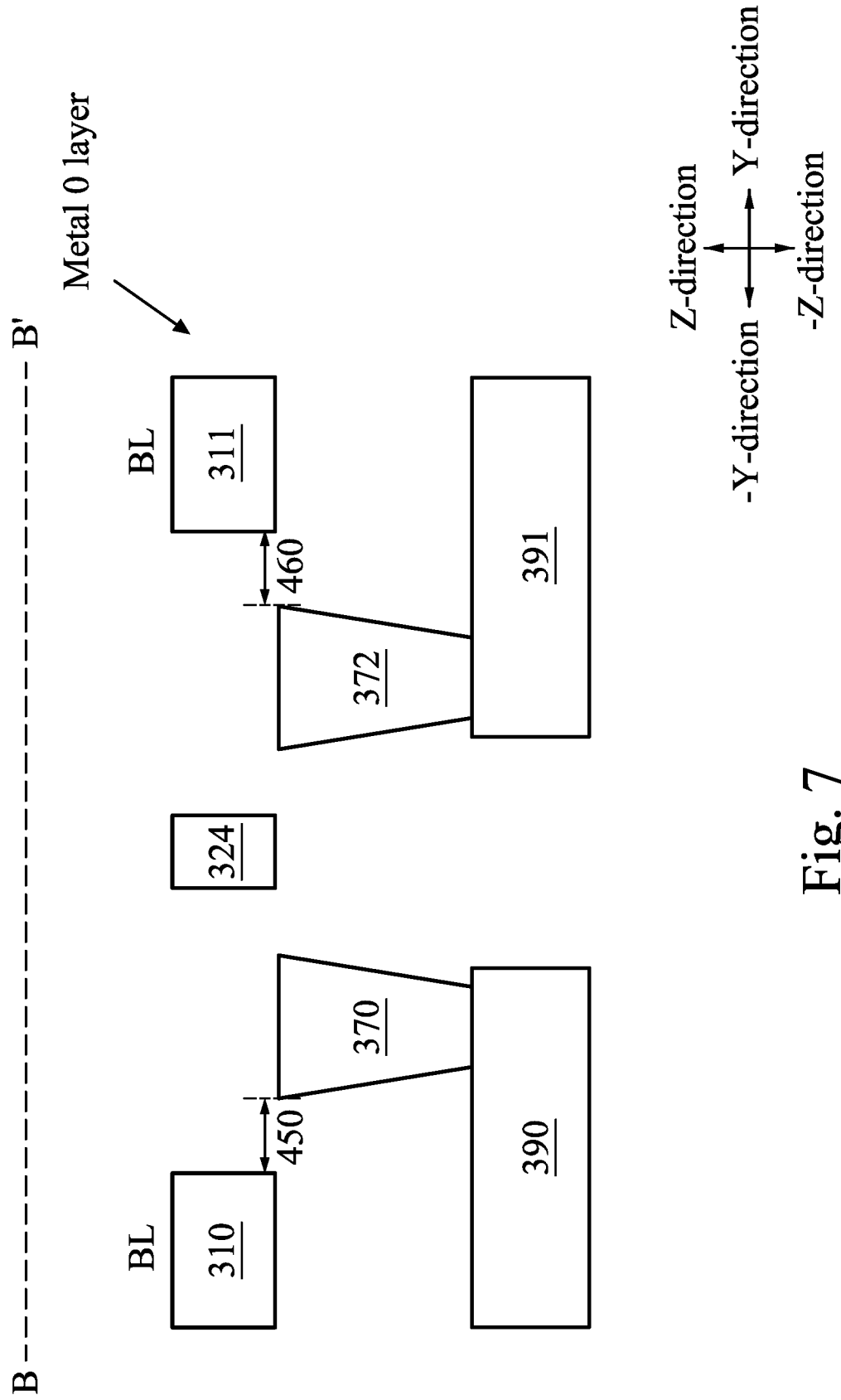
FIG. 7 illustrates a cross-sectional side view of another portion of an SRAM cell array according to an embodiment of the present disclosure.

FIG. 7 illustrates another fragmentary diagrammatic cross-sectional side view of a portion of a semiconductor device (e.g., a portion of the SRAM cell array 200) to further illustrate a location of the vias relative to the metal lines. The cross-sectional view in FIG. 7 is taken by taking the cross-sectional cut along a cutline B-B' in FIG. 4 in the Y-direction. In other words, the cross-sectional view in FIG. 7 is taken in a plane defined by the Y-direction (horizontally) and the Z-direction (vertically). As such, the cross-sectional view of FIG. 7 is perpendicular or orthogonal to the cross-sectional view of FIG. 6, since one is taken in the Y-Z plane, whereas the other is taken in the X-Z plane.

As shown in FIG. 7, the vias 370 and 372 are disposed over (and electrically connected to) the source/drain vias 390 and 391, respectively, in the Z-direction. The metal-0 layer has a more elevated position vertically than the vias 370 and 372 in the Z-direction. For example, the BLs 310-311 and the metal line 324 are disposed over (e.g., more vertically elevated), but are not electrically connected to, the vias 370 and 372. This is because SRAM design rules may specify that the vias should be electrically isolated from the BLs 310-311, so as to prevent undesirable bridging (e.g., electrical shorting) between them. As shown in FIGS. 4 and 7, a distance 450 separates the BL 310 from the via 370 in the Y-direction, and a distance 460 separates the BL 311 from the via 372 in the Y-direction. The value of the distance 450 and the value of the distance 460 may be substantially equal each other in some embodiments, or they may be different from each other in other embodiments.

Referring back to FIG. 4, one of the unique and novel physical features of the present disclosure is that the BLs 310-313 have substantially different top view profiles than the metal lines 320-332. For example, the edges of boundaries of the BLs 310-313 are each non-linear, such that they each includes a plurality of lateral protrusions in the Y-direction. In comparison, the metal lines 320-332 are substantially free of having lateral protrusions. In other words, whereas the metal lines 320-332 have substantially linear top view profiles in an ideal case (or on a lithography mask), the BLs 310-313 have zig-zag shaped top view profiles.

For example, as shown in FIG. 4, the BL 310 may include protrusions 500A and 500B, and the BL 311 may include a protrusion 501. The protrusions 500A and 500B each protrude laterally toward the BL 311 (or toward the metal line 324), and the protrusion 501 protrudes laterally toward the BL 310 (or toward the metal line 324). Although just one protrusion 501 is illustrated for BL 311 in FIG. 4, it is understood that the BL 311 may include a plurality of protrusions similar to the protrusion 501. These additional protrusions may be disposed relative to the protrusion 501 similar to how the protrusions 500A and 500B are disposed relative to one another. These additional protrusions are not specifically illustrated in FIG. 4 for space considerations (since FIG. 4 illustrates a partial top view of the SRAM cell array 200).

In some embodiments, the BL 310 and the BL 311 may be mirror images of each other (e.g., flipped 180 degrees with respect to the metal line 324), but they are also offset from each other in the X-direction. In other words, the protrusion 501 of the BL 311 may be substantially identical to the protrusion 500A, but is shifted further "down" in the X-direction. The BL 311 may have another protrusion that is substantially identical to the protrusion 500B, but such protrusion is located further "down" in the X-direction from the protrusion 501, and as such it is not visible in FIG. 4. Of course, it is understood that both the BL 310 and the BL 311 may have a plurality of other protrusions that repeat themselves periodically, similar to how the protrusions 500A and 500B are illustrated as being spaced apart from one another in FIG. 4.

Another way of looking at the protrusions 500A-500B and 501 is that the BL 310-311 may be said to have convex and/or concave regions (or convex and/or concave polygons), although these convex and concave regions need not be curved or rounded (e.g., they may or may not have substantially straight or linear edges or boundaries). For example, as shown in FIG. 4, the protrusion 501 of the BL 311 may be viewed as a convex region of the BL 311, since it protrudes outwardly (toward the metal line 324) in the −Y-direction. The protrusion 501 of the BL 311 protrudes outwardly as a rectangular protrusion in FIG. 4. Another way or expressing the protrusion 501 is that the portion of the BL 311 shown in FIG. 4 may be said to have a rotated "T-shape" top view profile. For example, the top view of the portion of the BL 311 in FIG. 4 may resemble the letter "T" when the BL 311 is rotated counterclockwise by 90 degrees. Conversely, the protrusions 500A and 500B of the BL 310, along with the rest of the BL 310 that does not protrude outwardly, collectively define a concave region 520. The concave region 520 may also be referred to as a recess, for example a rectangular recess. Since the BLs 310-311 are each continuous in the X-direction, it may be said that the BLs 310-311 may each have a plurality of convex regions (or a plurality of lateral protrusions), interposed by a plurality of concave regions (or a plurality of lateral recesses), or vice versa.

It is also understood that the BLs 312 and 313 may mirror the BLs 311 and 310, and as such they may also include similar (and mirrored) protrusions as the BLs 311 and 310, respectively. However, for reasons of simplicity, the protrusions of the BLs 312 and 313 are not specifically labeled herein.

One reason for configuring the BLs 310-313 to have such irregular top view shapes as discussed above is to reduce the electrical resistance of the BLs 310-313. In previous and older semiconductor technology nodes (e.g., nodes that are greater than 5 nanometer), device sizes are greater, and thus device parasitics (e.g., parasitic resistance) are not much of a concern. For example, a BL corresponding to the BL 310 in an older technology generation may have a substantially greater dimension in the Y-direction, or in other words, much "wider/thicker" than the BL 310. Since electrical resistance is inversely correlated with the width of a metal line, the electrical resistance of the BL for the older technology SRAM device may be sufficiently small such that it does not adversely affect device performance and can be ignored.

However, in newer technology nodes such as the 5-nanometer node or beyond (e.g., 3 nanometer node), the device sizes have shrunken to the point where device parasitics may substantially degrade device performance. For example, the lateral dimension 350 of the BL 310 may be small enough to increase parasitic resistance of the BL 310 to a point where a voltage drop across the length of the BL 310 (in the X-direction) can no longer be ignored. This situation is compounded by the fact that the BLs 310-313 continuously extend across many cells of the SRAM cell array 200 in the X-direction. The distant cells at the far "end" of the SRAM cell array would experience the greatest unintentional (and undesirable) voltage drop due to the fact that they experience the largest parasitic resistance, since the longer the BL 310-313, the larger the parasitic resistance. As an example, the voltage drop across the length of the BL 310-313 may worsen the Vmin of an SRAM cell. Vmin may be the lowest voltage at which an SRAM cell can be read. However, the voltage drop due to parasitic resistance across the length of the BL 310 may cause Vmin to be too high, which may cause the transistors of the SRAM cell to not be turned on (and thus the SRAM cannot be read).

The present disclosure achieves a reduction in the resistance of the BLs 310-313 by selectively enlarging the BLs 310-311 in the Y-direction when suitable. For example, the protrusions 500A-500B and 501 may be viewed as the lateral enlargement of the BLs 310-311. These protrusions 500A-500B and 501 protrude laterally into spaces between the BLs 310-311 and the metal line 324 without electrically shorting into the metal line 324 or the vias 370-373. For example, the protrusion 501 protrudes into a region between the via 372 and 373 without coming into physical contact with the metal line 324 or with the vias 372 and 373, since the vias 372 and 373 are disposed on opposite sides of the protrusion 501. Similarly, the protrusion 500A protrudes into a region between the via 370 and another via "above" the via 370 (not visible in FIG. 4) in the top view, and the protrusion 500B protrudes into a region between the via 371 and another via "below" the via 371 (not visible in FIG. 4) in the top view, without coming into physical contact with the metal line 324 or the vias 370-371. The vias 370 and 371 are located at least partially within the concave region 520 defined in part by the protrusions 500A-500B. Since the protrusion 501 is disposed between the vias 372-373, but no portion of the BL 310 is disposed between the vias 370-371, a distance separating the vias 370-371 in the X-direction is smaller than a distance separating the VDR vias 372-372 in the X-direction.

According to the present disclosure, a set of design rules are implemented with respect to the size and/or placement of the lateral protrusions 500A-500B and 501, so that they can reduce the resistance of the BLs 310-311 without creating risky electrical bridging issues. For example, the protrusions 500A-500B each have a dimension 420 measured in the Y-direction, and the protrusion 501 has a dimension 430 measured in the Y-direction. In some embodiments, the dimension 430 varies within a range between 0% and 100% of a width of the BL 311 in the Y-direction. In some embodiments, the dimensions 420 and 430 are equal to one another. In other words, the amount of protrusion exhibited by the BL 311 is substantially equal to the amount of recess defined by the BL 310. According to one design rule, 0<the dimension 420 (or the dimension 430)<N* the distance 450. In some embodiments, N is in a range between 0 and 2. Another design rule specifies that a distance 470 should be maintained in the X-direction between a via (e.g., the via 370) and the nearest protrusion (e.g., the protrusion 500A) of the BL. In some embodiments, the distance 470 is substantially equal to the distance 450. As such, the design rule 0< the dimension 420 (or the dimension 430)<N* the distance 470 may also hold. In some embodiments, the distance 450 and/or the distance 470 is configured to satisfy a minimum spacing design rule for a given technology node. For example, the distance 450 may be configured to be sufficiently long so that the BL 310 is not at significant risk of electrically shorting with the via 370 in the Y-direction, and the distance 470 may be configured to be sufficiently long so that the protruding portion 500A of the BL 310 is not at significant risk of electrically shorting with the via 370 in the X-direction. Another design rule specifies that a distance 480 should be maintained in the Y-direction between the protrusions 500A-500B and the metal line 324. In some embodiments, the distance 480 is also configured to satisfy a minimum spacing design rule for a given technology node. For example, the distance 480 may be configured to be sufficiently long so that the protruding portion 500A or 500B of the BL 310 is not at significant risk of electrically shorting with the metal line 324 in the Y-direction. In some embodiments, the distance 480=N*the distance 450, where N is in a range between 0 and 3. These design rules help ensure that the protrusions 500A-500B and 501 can extend as far as possible in the Y-direction without unduly increasing risks of electrical shorting with the nearby vias 370-373 or with the metal line 324.

In some embodiments, the shapes of the BLs 310-313 (e.g., the size, location, and profiles of their lateral protrusions) may be defined with sufficient precision using newer lithography methods such as extreme ultraviolet (EUV) lithography. Details regarding EUV lithography are discussed in U.S. patent application Ser. No. 15/851,829, filed on Dec. 22, 2017, entitled "Lithography Mask With a Black Border Region And Method of Fabricating The Same", the disclosure of which is hereby incorporated by reference in its entirety. With the use of EUV lithography, the present disclosure can selectively enlarge the BLs 310-313 wherever suitable without risking electrical bridging with nearby components.

It is understood that although the present disclosure herein has used BL as an example metal line in which the selective enlargement can achieve reduced electrical resistance (so as to improve parameters such as Vmin), the concepts discussed above may apply to other types of metal lines of an SRAM device as well. For example, a word line (WL) may be implemented as a metal line in a metal-1 layer that is located above the metal-0 layer in the Z-direction. The WLs may be selectively enlarged in a manner similar to how the BLs 310-313 are selectively enlarged (e.g., the lateral protrusions), and thus the WLs in an SRAM device may also achieve reduced electrical resistance and thereby improve device performance of the SRAM.

Figure 8:
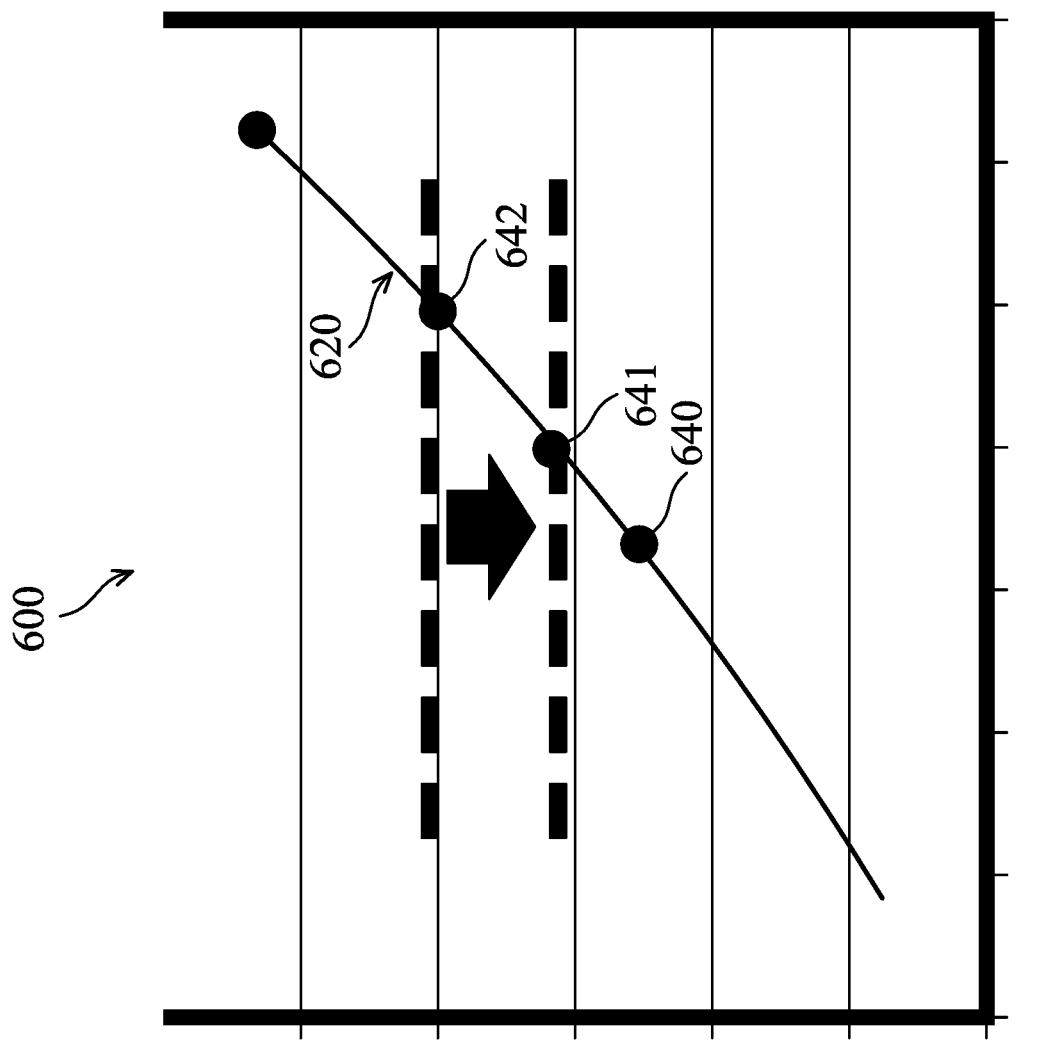
FIG. 8 illustrates a graph of voltage versus electrical resistance according to an embodiment of the present disclosure.

FIG. 8 is a graph 600 that illustrates how Vmin varies as a function of electrical resistance. In graph 600, the X-axis represents the value of the electrical resistance of the BL 310-313, and the Y-axis represents a value of Vmin, for example as a percentage of Vdd. The graph 600 illustrates a plot 620, which may include a plurality of data points such as data points 640, 641, and 642. Each of the data points 640-642 corresponds to a data sample collected from actually fabricated SRAM devices, where the electrical resistance values vary from one another. As is shown in FIG. 8, as electrical resistance decreases (e.g., from data point 642 to data point 641), the corresponding Vmin decreases as well, which translates to an improvement in SRAM device performance. This reduction in electrical resistance of the BL may be achieved by implementing the various aspects of the present disclosure discussed above. Experimental data has shown that, by selectively enlarging the BLs 310-313, the total area of the BLs may be increased by about 15%-25%. The increase in area of the BLs may lead to a reduction in the electrical resistance of the BLs, which results in a reduction of Vmin that may exceed at least 1% of the Vdd.

Figure 9:
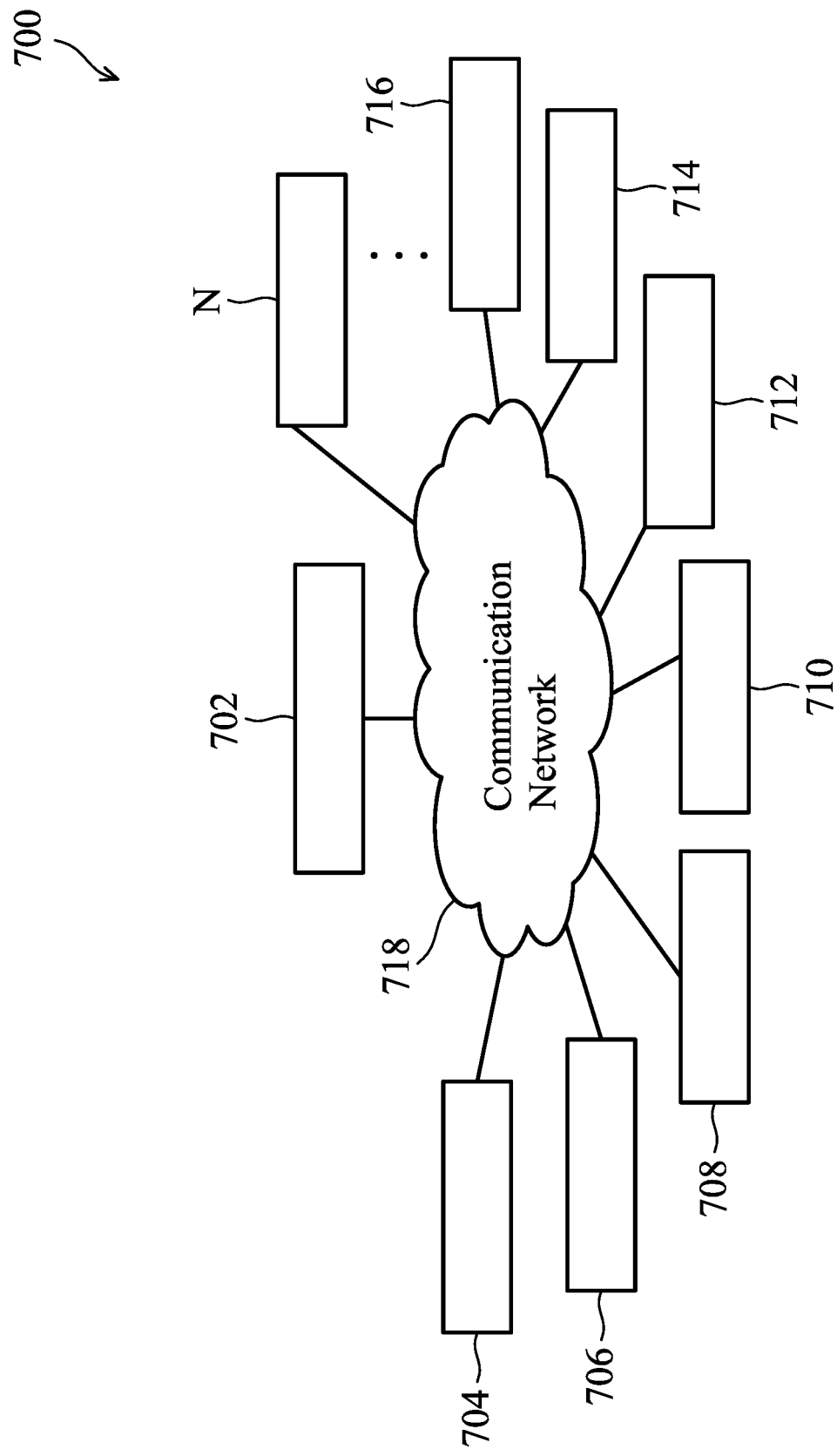
FIG. 9 illustrates an integrated circuit fabrication system according to an embodiment of the present disclosure.

FIG. 9 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products; the entity 706 represents an engineer, such as a processing engineer to control process and the relevant recipes, or an equipment engineer to monitor or tune the conditions and setting of the processing tools; the entity 708 represents a metrology tool for IC testing and measurement; the entity 710 represents a semiconductor processing tool, such an EUV tool that is used to perform lithography processes to define the irregularly shaped metal lines of an SRAM device; the entity 712 represents a virtual metrology module associated with the processing tool 710; the entity 714 represents an advanced processing control module associated with the processing tool 710 and additionally other processing tools; and the entity 716 represents a sampling module associated with the processing tool 710.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 700 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 10:
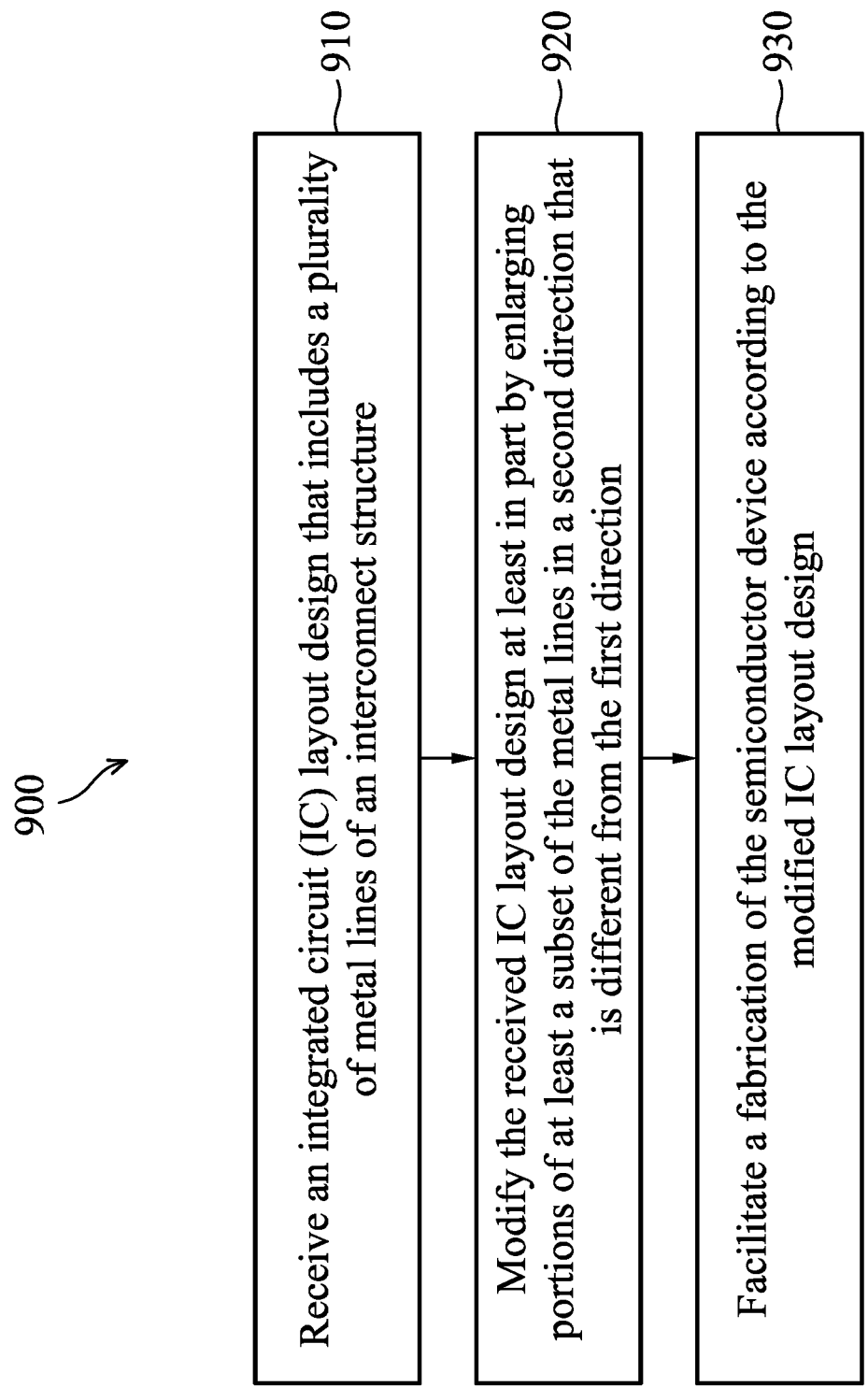
FIG. 10 is a flowchart illustrating a method of fabricating an SRAM device according to an embodiment of the present disclosure.

FIG. 10 is a flowchart illustrating a method 900 according to an embodiment of the present disclosure. The method 900 includes a step 910 of receiving an integrated circuit (IC) layout design that includes a plurality of metal lines of an interconnect structure. The IC layout design may be received from a fabless IC design house, for example. In some embodiments, the IC layout design may be a computer file in a Graphic Data System (GDS) format. The metal lines each extend in a first direction in a top view. In some embodiments, the received IC layout design comprises an IC layout design for a Static Random Access Memory (SRAM) device that includes a plurality of bit lines and a plurality of bit line bars. In some embodiments, the received IC layout design includes a plurality of vias that are disposed between the plurality of the metal lines in the top view.

The method 900 includes a step 920 of modifying the received IC layout design at least in part by enlarging portions of at least a subset of the metal lines in a second direction that is different from the first direction.

The method 900 includes a step 930 of facilitating a fabrication of the semiconductor device according to the modified IC layout design. In some embodiments, the facilitating the fabrication includes performing an extreme ultraviolet (EUV) process to form the subset of the metal lines. In some embodiments, the modifying the received IC layout design comprises enlarging the bit lines. In some embodiments, the enlarging includes enlarging the portions into spaces between the metal lines that are unoccupied by any of the vias.

It is understood that additional processes may be performed before, during, or after the steps 910-930 of the method 900. For example, the method 900 may include steps of forming active regions, fin structures, gate structures, source/drain regions, interconnect structures, and packaging, dicing, and testing processes. For reasons of simplicity, other additional steps are not discussed herein in detail.

Based on the above discussions, it can be seen that the present disclosure describes a solution to the problem of performance degradation due to increased effects of parasitic resistance as device sizes shrink. For example, as device dimensions shrink for an SRAM device, the BL—as a metal line in a metal interconnect layer—may see its resistance increase to the point where it may have a non-negligible impact on a voltage drop. As a result, voltage performance such as Vmin may be degraded. The present disclosure solves this problem by selectively enlarging the BLs where appropriate, for example by revising the IC layout such that the BLs may have lateral protrusions (or a zig-zag top view shape). The lateral protrusions may be positioned in a manner such that they protrude between certain vias in a top view. Design rules are also implemented to configure the size and/or placement of the lateral protrusions. The zig-zag top view profile or the presence of the lateral protrusions of the BLs may be a unique physical characteristic of SRAM devices that undergo the fabrication processes discussed above. They also may be a unique physical characteristic of lithography masks that are used to pattern the BLs.

Based on the above discussions, it can be seen that the present disclosure offers advantages over conventional SRAM devices. It is understood, however, that other embodiments may offer additional advantages, and not all advantages are necessarily disclosed herein, and that no particular advantage is required for all embodiments. One advantage is Vmin improvement due to reduced electrical resistance. Since the electrical resistance of a metal line such as BL is inversely correlated with an area of the metal line, the selectively enlargement of the metal line such as BL effectively increases the area of the metal line. Consequently, the resistance of the metal line may be reduced, which in turn reduces a voltage drop across the length of the metal line and improves Vmin performance of the SRAM. Another advantage is that the present disclosure does not unduly raise electrical bridging risks. For example, the lateral protrusions of the BLs are carefully positioned according to various design rules such that they are sufficiently separated from nearby conductive components such as vias or other metal lines. Accordingly, even though the overall area of the BLs is enlarged, the bridging risks still remain negligible. Other advantages include compatibility with existing SRAM design and manufacture, so the present disclosure does not require additional processing and is therefore easy and cheap to implement.

The advanced lithography process, method, and materials described above can be used in many applications, including but not limited to fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that although the present disclosure is discussed using an SRAM as an example, the concepts discussed herein may apply to other non-SRAM devices as well.

One aspect of the present disclosure pertains to a semiconductor device. The semiconductor device includes a gate structure, a source/drain, a first via that is disposed over the gate structure and the source/drain, and a first metal line having a more elevated vertical position than the first via in a cross-sectional view. The first via is electrically coupled to both the gate structure and the source/drain. The first metal line and the first via each extends in a first direction. A first distance separates the metal line from the via in a second direction different from the first direction. The first metal line includes a protruding portion that protrudes outwardly in the second direction.

Another one aspect of the present disclosure pertains to a semiconductor device. A first metal line extends in a first direction in a top view. The first metal line includes a protruded region. A second metal line extends in the first direction in the top view. The second metal line defines a recessed region. The protruded region points toward the recessed region in a second direction different from the first direction. A third metal line extends in the first direction in the top view and is disposed between the first metal line and the second metal line. The third metal line has a different geometric profile in the top view than the first metal line and the second metal line. A first via, a second via, a third via, and a fourth via each extends in the first direction in the top view. The first via and the second via are disposed between the first metal line and the third metal line. The third via and the fourth via are disposed between the second metal line and the third metal line. The first via and the second via are disposed on opposite sides of the protruded region. The third via and the fourth via are disposed at least partially within the recessed region.

Yet another aspect of the present disclosure pertains to a method of fabricating a semiconductor device. The method includes receiving an integrated circuit (IC) layout design that includes a plurality of metal lines of an interconnect structure. The metal lines each extend in a first direction in a top view. The method also includes modifying the received IC layout design at least in part by enlarging portions of at least a subset of the metal lines in a second direction that is different from the first direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
    a gate structure;
    a source/drain;
    a first via that is disposed over the gate structure and the source/drain, wherein the first via is electrically coupled to both the gate structure and the source/drain; and
    a first metal line having a more elevated vertical position than the first via in a cross-sectional view;
    wherein:
    the semiconductor device includes a FinFET fabricated according to a 5-nanometer technology node or a technology node smaller than the 5-nanometer technology node;
    the first metal line and the first via each extends in a first direction;
    a first distance separates the first metal line from the first via in a second direction different from the first direction; and
    the first metal line includes a protruding portion that protrudes outwardly in the second direction.

2. The semiconductor device of claim 1, wherein:
    the protruding portion has a first dimension measured in the second direction; and
    the first dimension is greater than 0 but less than N times the first distance, wherein N is greater than 0 and in a range between 0 and 2.

3. The semiconductor device of claim 1, wherein the first metal line is a metal line of a metal-0 layer of an interconnect structure.

4. The semiconductor device of claim 1, further comprising:
    a second via that extends in the first direction; and
    a second metal line and a third metal line that each extends in the first direction;
    wherein:
    the first metal line, the second metal line, and the third metal line each has a more elevated vertical position than the first via and the second via in the cross-sectional view;
    the third metal line is disposed between the first metal line and the second metal line in a top view;
    the first via is disposed between the first metal line and the third metal line in the top view; and
    the second via is disposed between the second metal line and the third metal line in the top view.

5. The semiconductor device of claim 4, wherein:
    the first metal line is a bit line (BL) of a Static Random Access Memory (SRAM) device; and
    the second metal line is a bit line bar (BLB) of the Static Random Access Memory (SRAM) device.

6. The semiconductor device of claim 4, wherein:
    the third metal line is a Vcc of a Static Random Access Memory (SRAM) device; and
    a dimension of the third metal line is smaller than a dimension of the first metal line or a dimension of the second metal line in the second direction.

7. The semiconductor device of claim 4, further comprising: a third via that extends in the first direction;
    wherein:
    the third via is disposed between the first metal line and the third metal line in the top view; and the protruding portion of the first metal line is disposed between the first via and the third via in the top view.

8. The semiconductor device of claim 7, further comprising: a fourth via that extends in the first direction; wherein:

the fourth via is disposed between the second metal line and the third metal line in the top view;

the second metal line includes a first protruding portion and a second protruding portion that each protrudes outwardly in the second direction toward the third metal line; and the second via and the fourth via are both disposed between the first protruding portion and the second protruding portion of the second metal line.

9. The semiconductor device of claim 8, wherein a distance separating the first via and the third via in the second direction is greater than a distance separating the second via and the fourth via in the second direction.

10. A semiconductor device, comprising:

a first metal line that extends in a first direction in a top view, wherein the first metal line includes a protruded region;

a second metal line that extends in the first direction in the top view, wherein the second metal line defines a recessed region, wherein the protruded region points toward the recessed region in a second direction different from the first direction;

a third metal line that extends in the first direction in the top view and is disposed between the first metal line and the second metal line, wherein the third metal line has a different geometric profile in the top view than the first metal line and the second metal line;

a first via, a second via, a third via, and a fourth via that each extends in the first direction in the top view;

wherein:

the first via and the second via are disposed between the first metal line and the third metal line;

the third via and the fourth via are disposed between the second metal line and the third metal line;

the first via and the second via are disposed on opposite sides of the protruded region; and the third via and the fourth via are disposed at least partially within the recessed region.

11. The semiconductor device of claim 10, wherein the third metal line is substantially free of having a protruded region or a recessed region.

12. The semiconductor device of claim 10, wherein the third metal line has a smaller lateral dimension in the second direction than both the first metal line and the second metal line.

13. The semiconductor device of claim 10, wherein:

the semiconductor device includes a Static Random Access Memory (SRAM) device;

one of the first and second metal lines corresponds to a bit line (BL) of the SRAM device; and another one of the first and second metal lines corresponds to a bit line bar (BLB) of the SRAM device.

14. The semiconductor device of claim 10, wherein:

the first via, the second via, the third via, and the fourth via are each located at a lower vertical elevation than the first metal line, the second metal line, and the third metal line in a cross-sectional view; and each of the first via, second via, third via, and the fourth via is electrically coupled to a respective gate via and a respective source/drain via.

15. A method of fabricating a semiconductor device, comprising:

receiving an integrated circuit (IC) layout design that includes a plurality of metal lines and a plurality of vias of an interconnect structure, wherein the metal lines each extend in a first direction in a top view, and wherein the vias are disposed between the metal lines in the top view; and modifying the received IC layout design at least in part by enlarging portions of at least a subset of the metal lines in a second direction that is different from the first direction, such that the enlarged portions of the at least the subset of the metal lines protrude toward the vias.

16. The method of claim 15, wherein:

the receiving the IC layout design comprises receiving an IC layout design for a Static Random Access Memory (SRAM) device that includes a plurality of bit lines; and the modifying the received IC layout design comprises enlarging the bit lines.

17. The method of claim 15, wherein:

the plurality of metal lines includes a first metal line and a second metal line; and the enlarging comprises enlarge end portions of the first metal line and a non-end portion of the second metal line.

18. The method of claim 15, further including: facilitating a fabrication of the semiconductor device according to the modified IC layout design.

19. The method of claim 18, wherein the facilitating the fabrication includes performing an extreme ultraviolet (EUV) process to form the subset of the metal lines.

20. The method of claim 15, wherein:

the IC layout design is generated by an IC design entity and received by an IC fabrication entity that is different from the IC design entity; and the modifying is performed by the IC fabrication entity.

* * * * *